US006815874B2

(12) United States Patent
Hermle et al.

(10) Patent No.: US 6,815,874 B2
(45) Date of Patent: Nov. 9, 2004

(54) FORM-ADAPTABLE ELECTRODE STRUCTURE IN LAYER CONSTRUCTION

(75) Inventors: Frank Hermle, München (DE); Peter Jänker, Garching (DE)

(73) Assignee: EADS Deutschland GmbH, Munich (DE)

( * ) Notice: Subject to any disclaimer, the term of this patent is extended or adjusted under 35 U.S.C. 154(b) by 149 days.

(21) Appl. No.: 10/097,151

(22) Filed: Mar. 12, 2002

(65) Prior Publication Data

US 2002/0130594 A1 Sep. 19, 2002

(30) Foreign Application Priority Data

Mar. 13, 2001 (DE) .......................................... 101 11 948

(51) Int. Cl.[7] .......................... H01L 23/485; H01L 41/08
(52) U.S. Cl. ...................... 310/365; 310/363; 310/364; 310/366
(58) Field of Search ................................ 310/363, 364, 310/365, 366

(56) References Cited

U.S. PATENT DOCUMENTS

| | | | | |
|---|---|---|---|---|
| 2,323,030 A | * | 6/1943 | Gruetzmacher | 310/322 |
| 4,939,452 A | * | 7/1990 | Reinholz | 324/754 |
| 5,574,382 A | * | 11/1996 | Kimura | 324/754 |
| 5,945,773 A | * | 8/1999 | Nagashima | 310/328 |
| 6,049,461 A | * | 4/2000 | Haghiri-Tehrani et al. | 361/737 |
| 6,215,228 B1 | * | 4/2001 | Yamazaki | 310/365 |
| 6,307,306 B1 | * | 10/2001 | Bast et al. | 310/366 |
| 6,545,395 B2 | * | 4/2003 | Matsui et al. | 310/369 |

FOREIGN PATENT DOCUMENTS

| | | | | |
|---|---|---|---|---|
| EP | 0 145 033 | | 6/1985 | |
| JP | 2000083388 A | * | 3/2000 | ............ H02N/2/00 |

* cited by examiner

Primary Examiner—Thomas M. Dougherty
Assistant Examiner—J. Aguirrechea
(74) Attorney, Agent, or Firm—Kenyon & Kenyon

(57) ABSTRACT

A form-adaptable electrode structure in layer construction includes at least two conductor layers, between which an insulating layer is disposed, the conductor layers having first and second electrode strips arranged in each case in parallel, and the electrode strips of the first conductor layer being arranged at an angle with respect to the electrode strips of the second conductor layer, so that a net-like structure is formed, and the first electrode strips of the first conductor layer being conductively interconnected with the first electrode strips of the second conductor layer, and the second electrode strips of the first conductor layer being conductively interconnected with the second electrode strips of the second conductor layer via the insulating layer at intersections of the net-like structure.

15 Claims, 1 Drawing Sheet

FORM-ADAPTABLE ELECTRODE STRUCTURE IN LAYER CONSTRUCTION

FIELD OF THE INVENTION

The present invention relates to a form-adaptable electrode structure in layer construction, e.g., for the contacting of flexible and bendable structures. For example, such structures may be piezoelectric elements in sensor and/or actuator systems.

BACKGROUND INFORMATION

The use of interdigital electrode structures for contacting electronic components, such as bipolar transistors, surface transducers, piezoelectric sensor-/actuator systems and the like, is conventional. Such a conventional interdigital electrode arrangement is illustrated schematically in FIG. 1. The interdigital electrode structure is usually applied at least on one surface of the electronic component. For protection purposes, generally, a final protective layer is applied on the electrode arrangement, which in turn was applied by vapor deposition or the methods (e.g., laminating, etching) conventional from printed circuit board technology. However, this protective layer cannot be seen in FIG. 1.

Furthermore, European Published Patent Application No. 0 145 033 describes a semiconductor arrangement having an interdigital electrode configuration. In this case, first and second strip-shaped electrodes are applied on a semiconductor arrangement, and in each case are connected to regions of a first and a second conduction type, respectively. So that electrical connections do not squander valuable active regions of the component, the terminal areas necessary for contacting the first and second strip-shaped electrodes situated in one plane, are arranged in a second plane. The second plane is above the plane containing the strip-shaped electrodes. However, such an electrode structure is aimed primarily at reducing the contact terminal areas, in order to waste as little active component area as possible for electrical connections.

The disadvantage of customary interdigital electrodes is that, in response to damage or a crack in a strip-shaped electrode, the flow of current is interrupted, which in turn disturbs the electrical field distribution. This has a negative influence on the functioning of the semiconductor component. Such damage can be formed by cracks and scratches of the metallic electrodes, which in turn can be produced by mechanical stresses in the component, i.e. by bending and deformation of the component.

It is therefore an object of the present invention to provide a reliable electrode structure which is robust, flexible and form-adaptable, in order to ensure the smooth functioning of an electrical component contacted by this electrode structure, even if strip-shaped electrodes of the electrode structure should fail.

SUMMARY

The above and other beneficial objects of the present invention are achieved by providing a form-adaptable electrode structure as described herein.

According to one example embodiment of the present invention, the form-adaptable electrode structure is distinguished by a layer construction made of at least two conductor layers, between which an insulating layer is arranged, the conductor layers in each case having first and second electrode strips arranged in parallel, and the electrode strips of the first conductor layer forming an angle with the electrode strips of the second conductor layer, so that a net-like structure is formed. The first electrode strips of the first conductor layer are conductively interconnected with the first electrode strips of the second conductor layer, and the second electrode strips of the first conductor layer are conductively interconnected with the second electrode strips of the second conductor layer by throughplating of the insulating layer at intersections of the net-like structure.

Such an electrode structure built up in layers permits a flow of current despite a failure of electrode strips, and specifically via the plated-through intersections of the insulating layer, so that as an alternative, the conductor tracks on the second conductor layer are used for transporting current. The electrode structure is thus safeguarded. This is particularly necessary when interconnecting or wiring bendable, movable or deformable components, since due to the deformation, the metallic electrode strips generally applied on the component by vapor deposition may get cracks or fractures.

Such an electrode structure may be applied on at least one surface of a base material, first a crack-stopper layer being applied on the surface, then the first conductor layer, followed by the first insulating layer, the second conductor layer and a final further insulating layer.

Such a layer structure may be distinguished by a simple construction which may be produced using customary vapor deposition processes. In addition, by applying a crack-stopper layer between the base material and the first conductor layer, the transfer of cracks to the layer structure is reduced or avoided.

The base material may include a piezoceramic plate, a piezoelectric element, a fibrous composite structure having piezoelectric structures, etc. Generally, the final insulating layer may be used to protect the layer structure.

Furthermore, to generate the field distribution necessary for the sensor suite or actuator suite of piezoelectric ceramic, positive voltage may be applied to the first electrode strips of the first conductor layer and negative voltage to the second electrode strips of the first conductor layer, or the other way around. Positive voltage may be applied to the first electrode strips of the second conductor layer, and negative voltage may be applied to the second electrode strips of the second conductor layer, or vice versa.

According to a further example embodiment of the present invention for generating a desired field distribution in a piezoelectric element, positive voltage is applied to the first electrode strips of the first conductor layer and negative voltage is applied to the second electrode strips of the second conductor layer, or vice versa. In the same manner, the first electrode strips of the second conductor layer may receive positive voltage and the second electrode strips of the first conductor layer may receive negative voltage, or vice versa. That is, the electrode strips may be interconnected as desired depending on the application case. This also implies that the sequence of the interconnection may be arbitrarily selected. That is, first and second electrode strips do not necessarily have to receive voltages of different polarity. Thus, the electrode structure of the present invention is distinguished by an extremely flexible applicability.

Furthermore, the electrode structure of the present invention may have the distinction that the angle between the electrode strips of the first conductor layer and the electrode strips of the second conductor layer is adjustable within a wide range from 0° to 180°. The angle may be, for example, 90°. However, it may be important that the exact value of the angle is not critical, so that high accuracy is not necessary during manufacturing. This simplifies the manufacturing process and keeps production costs low.

In the following, the invention is explained in greater detail with reference to the attached figures.

DETAILED DESCRIPTION

Figure 1:
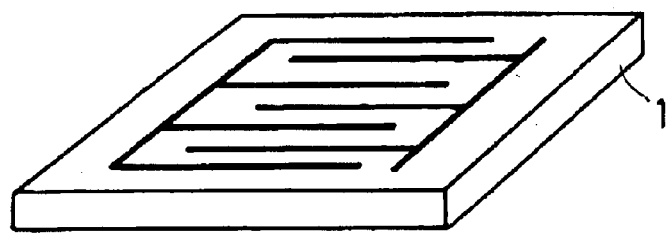
FIG. 1 illustrates a conventional interdigital electrode structure having finger-shaped electrodes.
Figure 2:
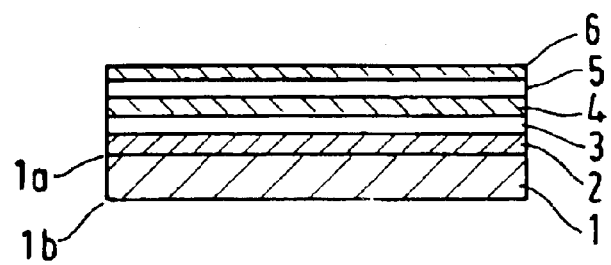
FIG. 2 is a schematic cross-sectional view of the layered electrode structure according to the present invention.

FIG. 2, in schematic representation, illustrates a cross-section through an electrode structure of the present invention in layer construction which is formed on a base material 1. For the sake of simplicity, in FIG. 2, the layer construction is illustrated merely on one surface 1a of base material 1. However, base material 1 may be provided with such a layer structure on both surface sides 1a, 1b. Base material 1 may include a piezoceramic structure or a fibrous composite structure having piezoelectric elements. Moreover, base material 1 may be any electronic component such as a semiconductor transistor, an interdigital transducer, etc. Base material 1 may exhibit a certain flexibility, permitting adaptation to curved structures by bending and deformation.

As illustrated in FIG. 2, a first layer 2 is arranged on surface 1a of base material 1. This first layer is used as a crack stopper and is typically 2 $\mu$m thick. This crack-stopper layer 2 is made, for example, of a polymer material. However, it is also possible to use other materials which are suitable for preventing crack branching from the base material to the layer structure. Disposed on crack-stopper layer 2 is a first conductor layer 3 which has a thickness of approximately 3 $\mu$m. This conductor layer 3 is typically deposited by epitaxial vapor deposition of a metallic substance. First conductor layer 3 has a plurality of parallel electrode strips A, B which are obtained by photolithograhic patterning of electrode or conductor layer 3 and subsequent etching. Disposed on conductor layer 3 is a first insulating layer 4 having a thickness of approximately 3 $\mu$m. The insulating layer may be made of polymer, i.e., polymide, or polyethylene naphthalate. A second conductor layer 5 is applied on this first insulating layer, in analogous manner to first conductor layer 3. Corresponding to first conductor layer 3, second conductor layer 5 is also made of strip-shaped electrodes A' and B', extending in parallel, which are likewise produced by photolithograhic patterning and subsequent chemical etching. Finally, a further insulating layer 6 is applied on second conductor layer 5 for protection purposes.

Figure 3:
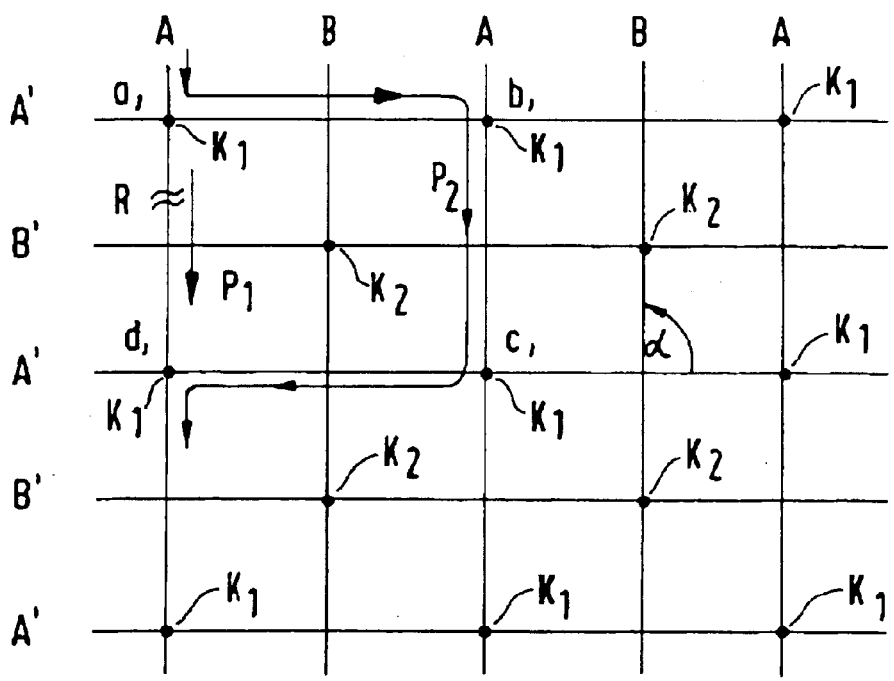
FIG. 3 is a schematic view of a net-like arrangement of electrode strips, formed by electrode strips of a first and of a second conductor layer.

In the following, the relative arrangement of the electrode strips in conductor layers 3 and 5 is described in greater detail with reference to FIG. 3. As mentioned above, conductor layers 3 and 5 have a strip-shaped structure with electrode fingers extending in parallel. The electrode strips have a width of approximately 5 $\mu$m. In FIG. 3, the individual parallel electrode strips of conductor layer 3 are designated by A and B. The electrode strips of conductor layer 5 arranged above it are designated correspondingly by A' and B'. As illustrated in FIG. 3, the electrode strips of first conductor layer 3 extend perpendicular to the electrode strips of second conductor layer 5. In FIG. 3, this angle is designated by $\alpha$. In addition to the angle of 90° illustrated in FIG. 3, in principle, any angle larger than 0° and smaller than 180° may be selected. This means that angle $\alpha$ is not critical when producing the electrode structure of the present invention, so that no exact alignment is necessary, which simplifies the manufacturing process and makes it cost-effective. Such an arrangement of electrode strips of the first and second conductor layers forms the netlike structure designated by N in FIG. 3.

As illustrated in FIG. 3, electrode strips A, B of first conductor layer 3 cross electrode strips A', B' of second conductor layer 5, both planes, however, being initially insulated electrically from one another by insulating layer 4. It should be noted that insulating layer 4 cannot be seen in FIG. 3. FIG. 3 illustrates a sequence of electrode strips ABA and A'B'A', respectively. The arrangement is not restricted to this sequence. Rather, any sequence as desired may be selected.

Furthermore, according to the present invention, first electrode strips A of conductor layer 3 are interconnected with first electrode strips A' of second conductor layer 5 at intersections designated by $K_1$ in FIG. 3. In analogous manner, second electrode strips B of first conductor layer 3 are interconnected with second electrode strips B' of second conductor layer 5 via intersections $K_2$. The contacting at intersections $K_1$, $K_2$ is implemented by throughplating of insulating layer 4. For example, this throughplating may be effected by thermal and/or mechanical action, or by overvoltage welding. Throughplating may also be effected by ultrasound.

The aim and object of the throughplating of insulating layer 4 at intersections $K_1$, $K_2$ becomes clear from the current paths illustrated in FIG. 3. It is assumed that first electrode strip A of first conductor layer 3 is interrupted, for example, by a crack R in the metallization. The result is that this electrode strip fails and no longer contributes to the electrical power supply of component 1. That is, the current is no longer able to flow directly along electrode strip A from point a) to point d), as would be the case without crack R. The normal case of the uninterrupted current flow is indicated in FIG. 3 by arrow $P_1$. To compensate for or bypass such a failure of an electrode strip, electrode strips A and B, as described above, are interconnected with corresponding electrode strips A' and B' of the other conductor layer via intersections $K_1$ and $K_2$, respectively. This ensures that the current is able to flow alternatively via intersection $K_1$ into corresponding electrode strip A' of the other conductor layer, and via it to point b). The current flow is able to branch at point b). For example, the current flows via a further intersection $K_1$ into a first electrode strip A of the first conductor layer, and along this electrode strip A from point b) to point c). In analogous manner, a further branching may occur at point c), so that the current transport is once more assumed by an electrode strip A' of the other conductor layer, and at point d), arrives again on original, interrupted electrode strip A via a further first intersection $K_1$. In this manner, crack R is effectively bypassed. In other words, by providing a further conductor layer having corresponding electrode strips, a security and redundancy are produced, so that if an electrode strip is interrupted, an alternative current path is automatically available. This alternative current path is denoted in FIG. 3 by arrow $P_2$, and indicates the current flow via points a), b), c) and d). In this manner, a reliable power supply continues to be ensured, and a possible loss of electrode strips is reliably prevented. Such losses may come about, for example, due to cracks in the metallic electrode fingers which, in turn, are produced by bending and deformation of the component on which they are applied. Consequently, the current is re-routed in a simple manner, so that an interruption of an electrode strip has no disadvantageous effects, and a reliable power supply is maintained.

Figure 4:
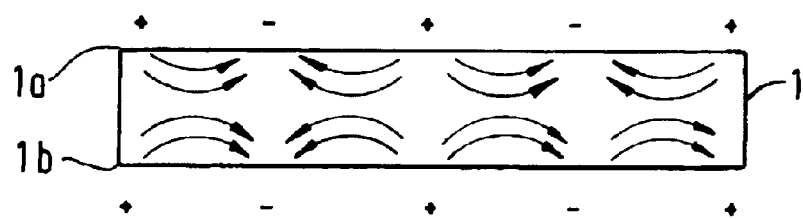
FIG. 4 illustrates schematically the field distribution in a component, on both surface sides of which an electrode structure of the present invention is disposed.

FIG. 4 illustrates a field distribution within a base material 1 which, for example, is a piezoelectric plate. In this context, an electrode structure of the present invention is applied on both surface sides 1a, 1b, and a positive voltage is applied to first electrode strips A of first conductor layer 3, and negative voltage is applied to second electrode strips B of first conductor layer 3, resulting in the field distribution illustrated in FIG. 4. This means that, in this case, first conductor layer 3 provides field-generating, strip-shaped electrodes A, B, and electrode strips A', B' of second conductor layer 5 are used for safeguarding field-generating, strip-shaped electrode strips A, B, namely, on the basis of the connection of corresponding first A, A' and second electrode strips B, B' at intersections $K_1$ and $K_2$, respectively, via insulating layer 4.

Electrode strips A', B' of second conductor layer 5 may also be used as field-generating electrodes, i.e., electrode strips A', B' receive positive and negative voltage, respectively, and electrode strips A, B of first conductor layer 3 are used for safeguarding the field-generating electrode strips on the basis of the contacting via insulating layer 4 at intersections $K_1$ and $K_2$, respectively. Moreover, an interconnection of the individual electrode strips may be selected such that, for example, first electrode strips A of first conductor layer 3 are acted upon with positive voltage, and second electrode strips B' of second conductor layer 5 are acted upon with negative voltage, or vice versa. The interconnection is selected depending upon the application requirement.

On the basis of the electrode structure of the present invention, a reliable power supply of a contacted component is achieved even if cracks or damage occur because of mechanical stresses, deformations, etc. in one or more strip-shaped electrodes.

What is claimed is:

1. A form-adaptable electrode structure in layer construction, comprising:
    at least two conductor layers; and
    a first insulating layer arranged between the conductor layers;
    wherein each conductor layer includes first and second electrode strips arranged in parallel, the electrode strips of a first conductor layer forming an angle with respect to the electrode strips of a second conductor layer to form a net structure, the first electrode strips of the first conductor layer conductively interconnected with the first electrode strips of the second conductor layer and the second electrode strips of the first conductor layer conductively interconnected with the second electrode strips of the second conductor layer via throughplating of the insulating layer at intersections of the net structure; and
    wherein one of the first electrode strips of the first conductor layer are configured to be acted upon with a first one of positive voltage and negative voltage and the second electrode strips of the second conductor layer are configured to be acted upon with a second one of positive voltage and negative voltage and the first electrode strips of the second conductor layer are configured to be acted upon with a first one of positive voltage and negative voltage and the second electrode strips of the first conductor layer are configured to be acted upon with a second one of positive voltage and negative voltage.

2. A form-adaptable electrode structure in layer construction, comprising:
    at least two conductor layers; and
    a first insulating layer arranged between the conductor layers;
    wherein each conductor layer includes first and second electrode strips arranged in parallel, the electrode strips of a first conductor layer forming an angle with respect to the electrode strips of a second conductor layer to form a net structure, the first electrode strips of the first conductor layer conductively interconnected with the first electrode strips of the second conductor layer and the second electrode strips of the first conductor layer conductively interconnected with the second electrode strips of the second conductor layer via throughplating of the insulating layer at intersections of the net structure; and
    wherein one of the first electrode strips of the first conductor layer are configured to be acted upon with a first one of positive voltage and negative voltage and the second electrode strips of the first conductor layer are configured to be acted upon with a second one of positive voltage and negative voltage and the first electrode strips of the second conductor layer are configured to be acted upon with a first one of positive voltage and negative voltage and the second electrode strips of the second conductor layer are configured to be acted upon with a second one of positive voltage and negative voltage.

3. An apparatus for conducting electrical current, comprising:
    a first conductor layer including at least two electrode strips arranged in parallel and electrically insulated from each other;
    a second conductor layer including at least two further electrode strips arranged in parallel and electrically insulated from each other, the further electrode strips forming an angle with the electrode strips of the first layer; and
    an insulating layer arranged between the first and second conductor layers, the insulating layer including throughplating connecting a first electrode strip of the first conductor layer and a first further electrode strip of the second conductor layer and connecting a second electrode strip of the first conductor layer and a second further electrode strip of the second conductor layer.

4. A form-adaptable electrode structure in layer construction, comprising:
    at least two conductor layers; and
    a first insulating layer arranged between the conductor layers;
    wherein each conductor layer includes first and second electrode strips arranged in parallel, the electrode strips of a first conductor layer forming an angle with respect to the electrode strips of a second conductor layer to form a net structure, the first electrode strips of the first conductor layer conductively interconnected with the first electrode strips of the second conductor layer and the second electrode strips of the first conductor layer conductively interconnected with the second electrode strips of the second conductor layer via throughplating of the insulating layer at intersections of the net structure.

5. The form-adaptable electrode structure according to claim 4, further comprising a base material and a crack-stopper layer arranged on at least one surface of the base material, the first conductor layer arranged on the crack-stopper layer, the first insulating layer arranged on the first conductor layer, the second conductor layer arranged on the insulating layer, a second insulating layer arranged on the second conductor layer.

6. The form-adaptable electrode structure according to claim 5, wherein the crack-stopper layer includes a polymer material.

7. The form-adaptable electrode structure according to claim 5, wherein the base material includes one of a piezoelectric ceramic, a piezoelectric element and a fibrous composite structure including a piezoelectric element.

8. The form-adaptable electrode structure according to claim 4, wherein the angle between the electrode strips of the first conductor layer and the electrode strips of the second conductor layer is larger than 0° and smaller than 180°.

9. The form-adaptable electrode structure according to claim 8, wherein the angle is about 90°.

10. The form-adaptable electrode structure according to claim 4, wherein the first insulating layer has a thickness of approximately 3 micrometers.

11. The form-adaptable electrode structure according to claim 4, wherein at least one of the at least two conductor layers is deposited by epitaxial vapor deposition of a metallic substance.

12. The form-adaptable electrode structure according to claim 4, wherein at least one of the first and second electrode strips in at least one of the first and second conductor layers is obtained by photolithographic patterning and subsequent etching.

13. The form-adaptable electrode structure according to claim 4, wherein the throughplating of the insulating layer at the intersections of the net structure is formed by at least one of thermal action, mechanical action, overvoltage welding, and ultrasound.

14. The form-adaptable electrode structure according to claim 4, wherein the first electrode strips of the first conductor layer are electrically insulated from the second electrode strips of the first conductor layer.

15. The form-adaptable electrode structure according to claim 4, wherein the first electrode strips of the second conductor layer are electrically insulated from the second electrode strips of the second conductor layer.

* * * * *

UNITED STATES PATENT AND TRADEMARK OFFICE
CERTIFICATE OF CORRECTION

PATENT NO.    : 6,815,874 B2
DATED         : November 9, 2004
INVENTOR(S)   : Hermle et al.

It is certified that error appears in the above-identified patent and that said Letters Patent is hereby corrected as shown below:

Column 5,
Line 63, change "conductor layer are configured to be acted upon with a" to
-- conductor layer is configured to be acted upon with a -- and Column 6,
Line 26, change "conductor layer are configured to be acted upon with a" to
-- conductor layer is configured to be acted upon with a --.

Signed and Sealed this

Tenth Day of May, 2005

JON W. DUDAS
*Director of the United States Patent and Trademark Office*